United States Patent [19]

Murayama

[11] Patent Number: 5,233,223
[45] Date of Patent: Aug. 3, 1993

[54] SEMICONDUCTOR DEVICE HAVING A PLURALITY OF CONDUCTIVE LAYERS INTERCONNECTED VIA A TUNGSTEN PLUG

[75] Inventor: Motoaki Murayama, Tokyo, Japan
[73] Assignee: NEC Corporation, Tokyo, Japan
[21] Appl. No.: 725,942
[22] Filed: Jun. 27, 1991

Related U.S. Application Data

[63] Continuation of Ser. No. 461,332, Jan. 5, 1990, abandoned.

[30] Foreign Application Priority Data

Jan. 9, 1989 [JP] Japan .................................. 1-3449

[51] Int. Cl.⁵ ...................... H01L 23/48; H01L 29/40; H01L 29/46; H01L 29/44
[52] U.S. Cl. .................................. 257/770; 257/734; 257/748; 257/753
[58] Field of Search ....................... 357/42, 71, 24, 46; 257/734, 736, 748, 753, 754, 755, 770, 781, 761

[56] References Cited

U.S. PATENT DOCUMENTS

| | | | |
|---|---|---|---|
| 4,782,380 | 11/1988 | Shankar et al. | 357/71 |
| 4,882,753 | 4/1989 | Pintchovski et al. | 357/71 |
| 4,920,397 | 4/1990 | Ishijima | 357/42 |
| 4,926,237 | 5/1990 | Sun et al. | 357/71 |
| 4,933,303 | 6/1990 | Mo | 357/71 |
| 4,970,574 | 11/1990 | Tsunenari | 357/71 |

*Primary Examiner*—Andrew J. James
*Assistant Examiner*—Carl Whitehead, Jr.
*Attorney, Agent, or Firm*—Laff, Whitesel, Conte & Saret

[57] ABSTRACT

A semiconductor device comprises a semiconductor substrate, plural conductive lead circuit layers, one or more intermediate insulating layers interposed between the conductive lead circuit layers, and plural hole made in respective intermediate insulating layer. The hole has both a width larger than a width of the connection portion of the first conductive lead circuit layer positioned under the via and a depth that at least a top face of the connection portion of the first conductive lead circuit layer is exposed, and a tungsten plug has a width layer than the width of the connection portion of the first conductive lead circuit layer, formed over at least the top face of the connection portion of the lower lead circuit layer 3. A gap between the conductive plug and the inner wall of the hole, is filled up with insulating material to form a flat surface on which the second conductive lead circuit layer is formed.

6 Claims, 4 Drawing Sheets

F I G. 3(a)
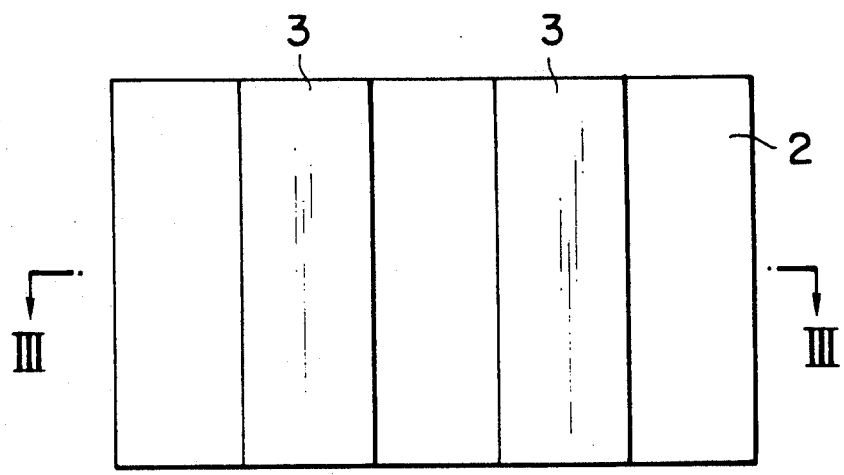
F I G. 3(b)
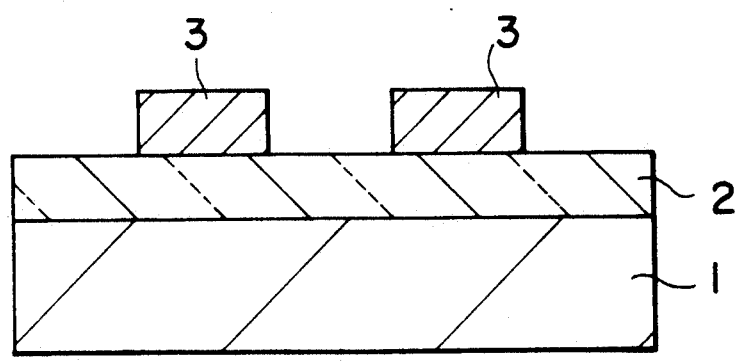

F I G. 4(a)
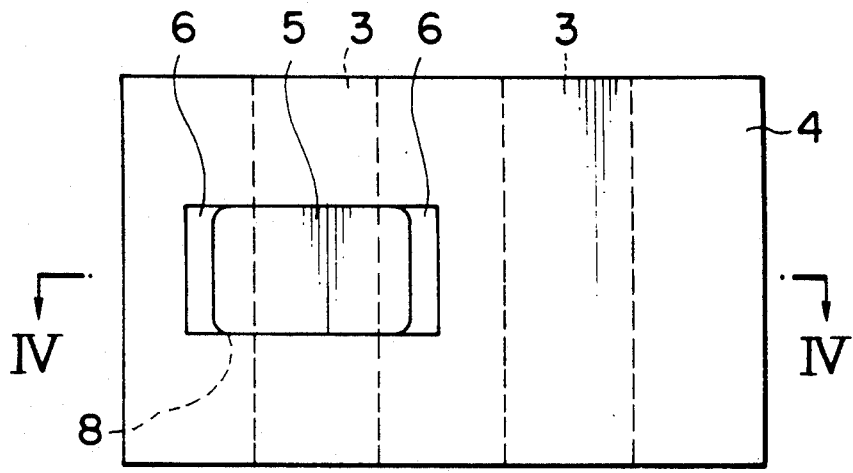
F I G. 4(b)
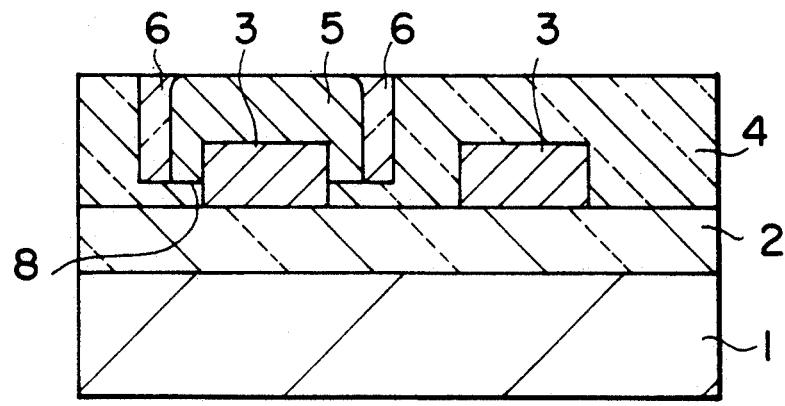

SEMICONDUCTOR DEVICE HAVING A PLURALITY OF CONDUCTIVE LAYERS INTERCONNECTED VIA A TUNGSTEN PLUG

This application is a continuation of application Ser. No. 07/461,332, filed Jan. 5, 1990 abandoned.

BACKGROUND OF THE INVENTION

The present invention relates to a semiconductor device of multilayer structure, and particularly to a semiconductor device including fine conductive lead circuit layer. Further the present invention relates to a method for manufacturing the semiconductor device.

Heretofore a conventional semiconductor device of multilayer structure has had a circuit structure somewhat as shown in FIGS. 1 (a) and (b). The semiconductor device comprises a silicon substrate 1, a silicon oxide layer 2, a first aluminum lead circuit layer 3, a silicon oxide layer 4 and a second aluminum lead circuit layer 7.

The silicon oxide layer 2 is layered on the silicon substrate 1. The first aluminum lead circuit layers 3 are provided on the silicon oxide layer 2. The silicon oxide layer 4 having plural holes 8 is provided over the first aluminum lead circuit layer 3 and the silicon oxide layer 2 by depositing silicon oxide on the first aluminum lead circuit layer 3 and the silicon oxide layer 2 by the bias ECR (Electron Cyclotron Resonance) plasma CVD (Chemical Vapor Deposition), forming a photo resist pattern on the formed silicon oxide layer and anisotropically etching the holes 8. The upper aluminum lead circuit layer 7 is provided on the silicon oxide dielectric layer 4 having the holes 8.

In the above-mentioned conventional semiconductor device, a line width of the first aluminum lead circuit layer 3 is partially widened at a connection portion thereof with the second aluminum lead circuit layer 7. For this reason, if a width of the lower aluminum lead circuit layer 3 is 1.0 μm, a distance between the first aluminum lead circuit layers 3 is 1.0 μm, an area of the holes 8 is 1.0 μm$^\square$, and allowance of the holes 8 against the adjacent first aluminum circuit layer 3 is 0.5 μm, the pitch of the first aluminum lead circuit layers 3 becomes 2.5 μm.

As above-mentioned, in the conventional semiconductor device, in order to prevent the holes 8 from locating outside the connection portion of the lower aluminum lead circuit layer 3, a line width of the lower aluminum lead circuit layer 3 is partially widened at the connection portion of the lower aluminum lead circuit layer 3 with the upper aluminum lead circuit layer 7. Therefore a pitch between the lower aluminum lead circuit layer 3 having, the connection portion thereof with the upper aluminum lead circuit layer and the adjacent lower aluminum lead circuit layer 3 not having it is increased as compared with a pitch between the two lower aluminum lead circuit layers each not having the connection portion thereof with the upper aluminum lead circuit layer, which hinders the semiconductor integrated circuit from being formed with high layout density.

SUMMARY OF THE INVENTION

An object of the invention is to provide a semiconductor device including fine conductive lead circuit layer in which the necessity of widening a line width of a connecting part of a lower conductive lead circuit layer with an upper conductive lead circuit layer than the other part of the lower conductive lead circuit layer so that the pitch of the lower conductive lead circuit layers can be decreased, thus layout density of the semiconductor device being heightened.

A further object of the present invention is to provide the above-mentioned semiconductor device.

The above object of the present invention is attained by a semiconductor device comprising a semiconductor substrate, a insulating layer formed on the semiconductor substrate, plural conductive lead circuit layers including a first conductive lead circuit layer and a second conductive lead circuit layer, the first conductive lead circuit layer formed on the semiconductor substrate, the second conductive lead circuit layer formed on an intermediate insulating layer formed on the first conductive lead circuit layer, plural holes made in the intermediate insulating layer, each hole having both a width larger than a width of a connection portion of a first conductive lead circuit layer and a depth that at least a top face of the connection portion of said first conductive lead circuit layer is exposed, conductive plugs in the via holes for electrically connecting between the connection portions of the first conductive lead circuit layer and the second conductive lead circuit layer, each of said conductive plugs having a width larger than the width of the connection portion of the first conductive lead circuit layer and formed over at least the top faces of the connection portions of the first conductive lead circuit layer.

The further object of the present invention is accomplished by a method for manufacturing a semiconductor device comprising the steps of:

depositing first insulating material on a semiconductor substrate to form an insulating layer;

depositing first conductive material on the first insulating layer and patterning the formed first conductive material layer into a form of a first conductive lead circuit layer to form the first conductive lead circuit layer;

depositing second insulating material over the first conductive lead circuit layer and the surface of the insulating layer and selectively etching the formed insulating material layer to form holes each having both a width larger than a width of a connection portion of the first conductive lead circuit layer and a depth that at least a top face of the connection portions of the first conductive lead circuit layer is exposed whereby an intermediate insulating layer provided with the holes is formed;

depositing second conductive material over at least top faces of the connection portions of the first conductive lead circuit layer in the holes to form conductive plugs each having a width larger than the width of the connection portion of the first conductive lead circuit;

filling up spaces between the conductive plugs and the inner walls of the holes with third insulating material and etching back the intermediate insulating layer, the conductive plugs and the filled insulating material layers in the spaces to planarize them; and depositing third conductive material on the intermediate insulating layer and patterning the formed conductive layer into a form of a second conductive lead circuit layer to form the second conductive lead circuit layer, in which the connection portions of the second conductive lead circuit layer is connected with the connection portions of the first conductive lead circuit layer through the conductive plugs.

In the present invention, as conductive material for conductive lead circuit layer, aluminum, tungsten or polysilicon can be used. When tungsten or polysilicon is used instead of aluminum, anti-migration property can be remarkably improved as compared with aluminum.

In the present invention, as material of insulating layer and intermediate insulating layer, silicon oxide or boronphosphosilicate can be used.

In the present invention, the conductive plug is formed of tungsten. Tungsten has low resistance and not interact with aluminum used mainly as material for conductive lead circuit layer.

In the present invention, the width of the connection portion of the lower conductive lead circuit layer can be the same width as the line width of the lower conductive lead circuit layer.

In the semiconductor device according to the present invention, it is preferable that a space between the conductive plug and the inner wall of the viahole which is formed due to the misregister of the viahole relative to the connection portion of the first conductive lead circuit layer is filled up with the third insulating material and tops of conductive plug and the filled insulating material layer in the space are together planarized to the same lead as the surface of the intermediate insulating layer.

In the present invention, as the third insulating material for filling up the space, silica, boronphosphosilicate or other dielectric material can be applied.

In the present invention, the top face and upper side wall portion leading said face of the connection portion of the first conductive lead circuit layers may be connected with the conductive plug to give a reliable contact of the first conductive lead circuit layers with the conductive plugs.

A depth of the hole should be formed to such a depth that insulating film is left under the hole.

According to the present invention, as the conductive plugs have width larger than that of the lower conductive lead circuit layer, size of the hole can be set at a sufficiently large size in consideration of misregister of the hole relative to the connection portion, while a line width of the first conductive lead circuit layer can be left as it is, that is the necessity of widening a width of the first conductive lead circuit layer at the connection portion is eliminated. As a result, the pitch of the first conductive lead circuit layers can be reduced to heighten layout density of the semiconductor device. Also, according to the present invention, it can be eliminated that a hole is made outside the connection portion of the conductive lead circuit layer.

Further according to the present invention, a high flatness of the intermediate insulating layer can be gained and the second conductive lead circuit layer can be formed on the flat surface of the intermediate insulating layer.

BRIEF DESCRIPTION OF THE DRAWINGS

FIGS. 3(a) and (b) show a process of forming the lower conductive lead circuit layer, FIG. 3(a) being a plan view thereof and FIG. 3(b) being a cross-sectional view taken on line III—III in FIG. 3(a); and FIGS. 4(a) and (b) show a process of forming a tungsten plug and the intermediate insulating layers, FIG. 4(a) being a plan view thereof and FIG. 4(b) being a cross-sectional view taken on line IV—IV in FIG. 4(a).

DETAILED DESCRIPTION OF THE INVENTION

Figure 1A:
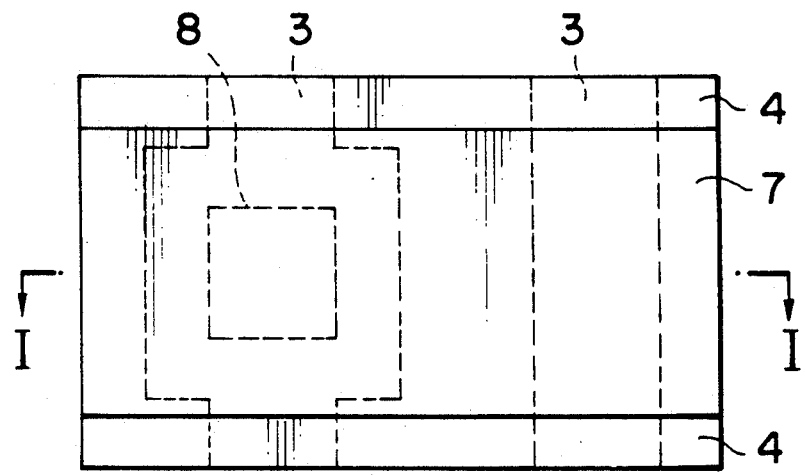
FIGS. 1(a) and (b) show a conventional illustration of semiconductor device, FIG. 1(a) being a plan view thereof, FIG. 1(b) being a cross-sectional view taken on line I—I in FIG. 1(a)
Figure 1B:
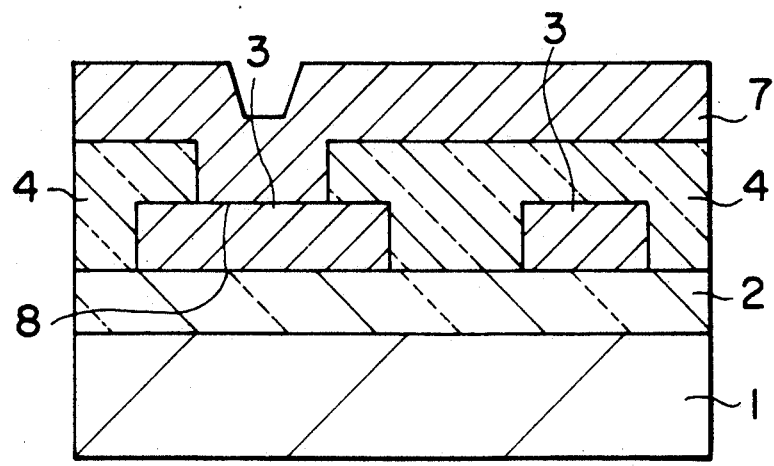
Figure 2A:
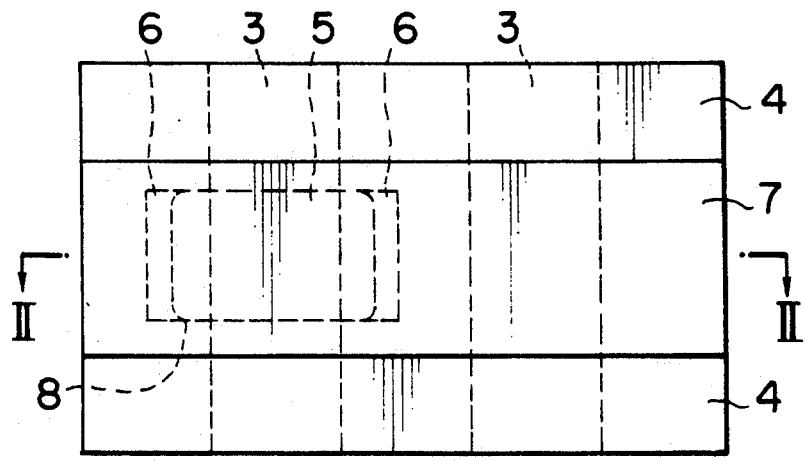
FIGS. 2(a) and (b) show one embodiment of the present invention, FIG. 2(a) being a plan view thereof and FIG. 2(b) being a cross-sectional view taken on line II—II in FIG. 2(a)

FIGS. 2(a) and (b) show one embodiment of the present invention.

Referring to FIGS. 2(a) and (b), a semiconductor device of the present embodiment comprises a silicon substrate 1, a first silicon oxide film 2 as an insulating layer layered on the silicon substrate 1, a first aluminum lead circuit layer 3 formed on the first silicon oxide film 2, and a second silicon oxide film 4 layered over a first aluminum lead circuit layer 3 and the surface of the first silicon oxide film 2 and a second aluminum lead circuit layer 7 formed on the second silicon oxide film 4.

Vias 8 (in FIGS. 2(a) and (b), only a one via is shown) are made in the second silicon oxide film 4 a sufficiently large size to permit a considerable misregister of the hole relative to the connection portion of the first aluminum lead circuit layer. The holes 8 each have both a width larger than a width of a connection portion of the first aluminum lead circuit layer 3 positioned under the hole 8 and a depth that at least a top face of the connection portion of the first aluminum lead circuit layer 3 is exposed. In the hole 8, tungsten plug 5 as a conductive plug is formed for electrically connecting between the connection portions of the first aluminum lead circuit layer 3 and the second aluminum lead circuit layer 7 confronting the first aluminum lead circuit layer 3. The tungsten plug 5 has a width larger than the width of the connection portion of the lower conductive lead circuit and formed over the top face and an upper side wall portion leading said face of the connection portion of the first aluminum lead circuit layer 3.

In the embodiment as shown in FIGS. 2(a) and (b), a space between the tungsten plug 5 and the inner wall of the hole 8, which is formed to tolerate a possible misregister of the hole 8 relative to the connection portion of the first aluminum lead circuit layer, is filled up with silica deposited in the space and heat-treated to form a flat surface on which the second aluminum lead circuit layer 7 is formed. Material filled in the space is not restricted in silica. Any insulating material which can be filled in the space can be used.

Characteristic of the present invention resides in that hole has both a width larger than a width of the connection portion of the first aluminum lead circuit layer 3 positioned under the hole 8 and a depth that at least a top face of the connection portion of the first conductive lead circuit layer is exposed, and that a tungsten plug has a width larger than the width of the connection portion of the first conductive lead circuit layer 3 and formed over at least the top face of the connection portion of the first aluminum lead circuit layer 3.

Then, a method for manufacturing a semiconductor device is explained with reference to FIGS. 3(a), (b) and 4(a), (b).

As shown in FIGS. 3(a) and (b), aluminum film with about 0.5 μm in thickness is formed on the silicon oxide film 2 formed on the silicon substrate 1, and patterned into a form of a first aluminum lead circuit layer by the conventional photo etching method to form the first aluminum lead circuit layer 3.

Then, as shown in FIGS. 4(a) and (b), silicon oxide film 4 with about 0.9 μm in thickness is formed over the first aluminum lead circuit layer 3 and the surface of the silicon oxide film 2, by bias electron cyclotron resonance plasma chemical vapor deposition. Thereafter, a hole 8 having both a width larger than a width of the connection portion of the first aluminum lead circuit layer 3 and a depth that at least a top face of the connection portion of the first aluminum lead circuit layer is exposed is formed by anisotropically etching the second silicon oxide film 4 at a sufficiently large size in order to tolerate a considerable misregister of the hole relative to the connection portion of the first conductive lead circuit layer. Then the tungsten plug 5 with about 0.4 μm in thickness is formed in the hole 8 by the chemical vapor deposition in which tungsten is selectively grown. Thereafter, between the tungsten plug 5 and the second silicon oxide film 4, silica is deposited and etched back and then heat-treated to form silica film 6.

Figure 2B:
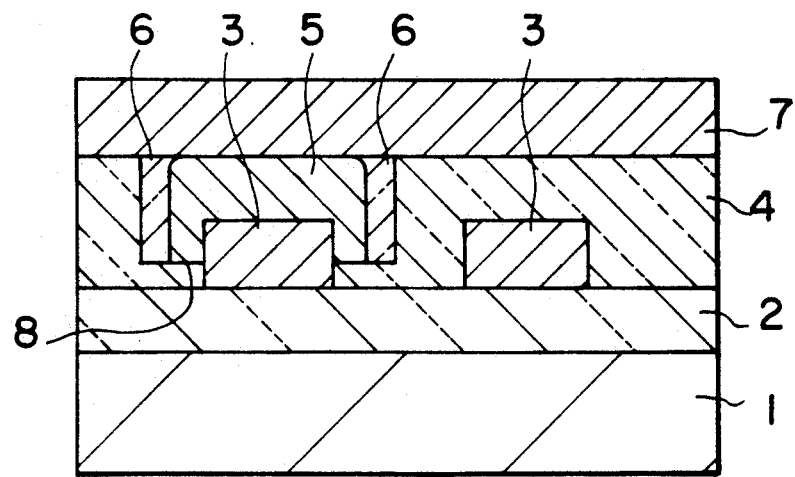

Lastly, as shown in FIGS. 2 (a) and (b), aluminum is deposited to about 1.0 μm in thickness and patterned into a form of a second aluminum lead circuit layer by the conventional photo etching method to form the second aluminum lead circuit layer 7 electrically connected with the tungsten plug 5.

In the present embodiment, when a width of the first aluminum lead circuit layer 3 is 1.0 μm, a distance between the lead circuits in the first aluminum lead circuit layer is 1.0 μm, and an area of the via 8 is 1.0 μm ×2.0 μm, a pitch of the lead circuits in the first aluminum lead circuit layer is 2.0 μm.

In the present invention, as material of the first and second lead circuit layers, aluminum has been used. However instead of aluminum, refractory metal having high melting point such as tungsten or other conductive material such as high conductive polysilicon. When the refractory metal such as tungsten or other conductive material such as high conductive polysilicon is used, anti-migration property can be remarkably improved as compared with aluminum.

What is claimed is:

1. A semiconductor device comprising a semiconductor substrate, an insulating layer formed on said semiconductor substrate, a plurality of conductive lead circuit layers including a first conductive lead circuit layer and a second conductive lead circuit layer, said first conductive lead circuit layer being formed over the semiconductor substrate, said second conductive lead circuit layer being formed over an intermediate insulating layer formed over said first conductive lead circuit layer, a plurality of holes formed in the intermediate insulating layer and extending between said first and second conductive layers, each of said holes having a width which is larger than a width of a connection portion of said first conductive lead circuit layer exposed in said hole, said hole having a depth that exposes both a top face and an upper side face of the connection portion of said first conductive lead circuit layer, conductive plugs in the holes for making electrical connections between the connection portions of said first conductive lead circuit layer and said second conductive lead circuit layer exposed in said hole, a cross section of said plugs being smaller than cross sections of said holes in at least one dimension to leave at least one space between a plug and an inner wall of said hole, each of said conductive plugs having a width which is larger than the width of said connection portion of the first conductive lead circuit layer and being formed over both the top face and at least an upper side face of said connection portions of the first conductive lead circuit layer, and an insulating material filling said space between said conductive plugs and the inner walls of said holes.

2. A semiconductor device as claimed in claim 1, wherein the width of the connection portion of the first conductive lead layer is the same as the width of the first conductive lead circuit layer.

3. A semiconductor device as claimed in claim 1, wherein the conductive plug includes tungsten.

4. A semiconductor device as claimed in claim 3, wherein the insulating material filling the gap includes silica.

5. A semiconductor device as claimed in claim 1, wherein the conductive lead circuit layer includes a material taken from a group consisting of aluminum, tungsten, and polysilicon.

6. A semiconductor device as claimed in claim 1, wherein the insulating layer and the intermediate insulating layer includes a material is taken from a group consisting of silicon oxide and boronphosphosilicate.

* * * * *